United States Patent
Lin

(10) Patent No.: US 8,388,756 B2
(45) Date of Patent: Mar. 5, 2013

(54) EVAPORATION SOURCE AND VAPOR DEPOSITION APPARATUS USING THE SAME

(75) Inventor: Sheng-Lai Lin, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 389 days.

(21) Appl. No.: 12/771,258

(22) Filed: Apr. 30, 2010

(65) Prior Publication Data
US 2011/0076398 A1    Mar. 31, 2011

(30) Foreign Application Priority Data
Sep. 25, 2009  (CN) .......................... 2009 1 0307692

(51) Int. Cl.
*C23C 16/44* (2006.01)

(52) U.S. Cl. ........................................ 118/726; 392/386
(58) Field of Classification Search ................... 118/726; 392/386; 427/248.1
See application file for complete search history.

(56) References Cited

U.S. PATENT DOCUMENTS
2011/0076398 A1* 3/2011 Lin ............................. 427/248.1

FOREIGN PATENT DOCUMENTS
EP            0736611 A1   10/1996

* cited by examiner

*Primary Examiner* — Sylvia R. MacArthur
(74) *Attorney, Agent, or Firm* — Altis Law Group, Inc.

(57) ABSTRACT

An evaporation source that causes the evaporation bars to vaporize and emit small particles. The small particles of the evaporation bars are evenly dispersed all around the evaporation source. Thus, the particles then accumulate on workpieces to form symmetrical films. A vapor deposition apparatus using the present evaporation source is also described.

12 Claims, 6 Drawing Sheets

EVAPORATION SOURCE AND VAPOR DEPOSITION APPARATUS USING THE SAME

BACKGROUND

1. Technical Field

The present disclosure relates to an evaporation source and a vapor deposition apparatus using the evaporation source.

2. Description of Related Art

Vapor deposition has been widely used to form functional or decorative films on various electronic components, such as semiconductors, liquid crystal displays (LCD), organic electroluminescent displays, and electronic device housings. Typically, in the vapor deposition process, evaporation materials and substrates are placed into a vacuum chamber. An evaporation source heats and vaporizes the evaporation materials for deposit on the substrates, thereafter, forming films directly attached to the substrates.

The evaporation source made of electrically resistive material can be referred to as resistive evaporator. FIGS. 5 and 6 show a conventional resistive evaporator 100 including two electrically conductive pillars 10. A plurality of equal-lengthed supporting poles 12 symmetrically protrude from two sides of each conductive pillar 10. The plurality of supporting poles 12 are evenly spaced from each other. Each two supporting poles 12 support a heating resistor 14. A wire shaped evaporation material can be twisted onto the heating resistor 14. A plurality of substrates to be coated surround the evaporation source. However, the vaporized evaporation material does not always symmetrically distribute within the vacuum chamber, and thus cannot produce deposited films with a uniform thickness on the substrates.

Therefore, there is room for improvement within the art.

BRIEF DESCRIPTION OF THE DRAWINGS

Many aspects of the evaporation source and vapor deposition apparatus using the evaporation source can be better understood with reference to the following drawings. The components in the drawings are not necessarily to scale, the emphasis instead being placed upon clearly illustrating the principles of the evaporation source and vapor deposition apparatus using the same.

DETAILED DESCRIPTION

Figure 1:
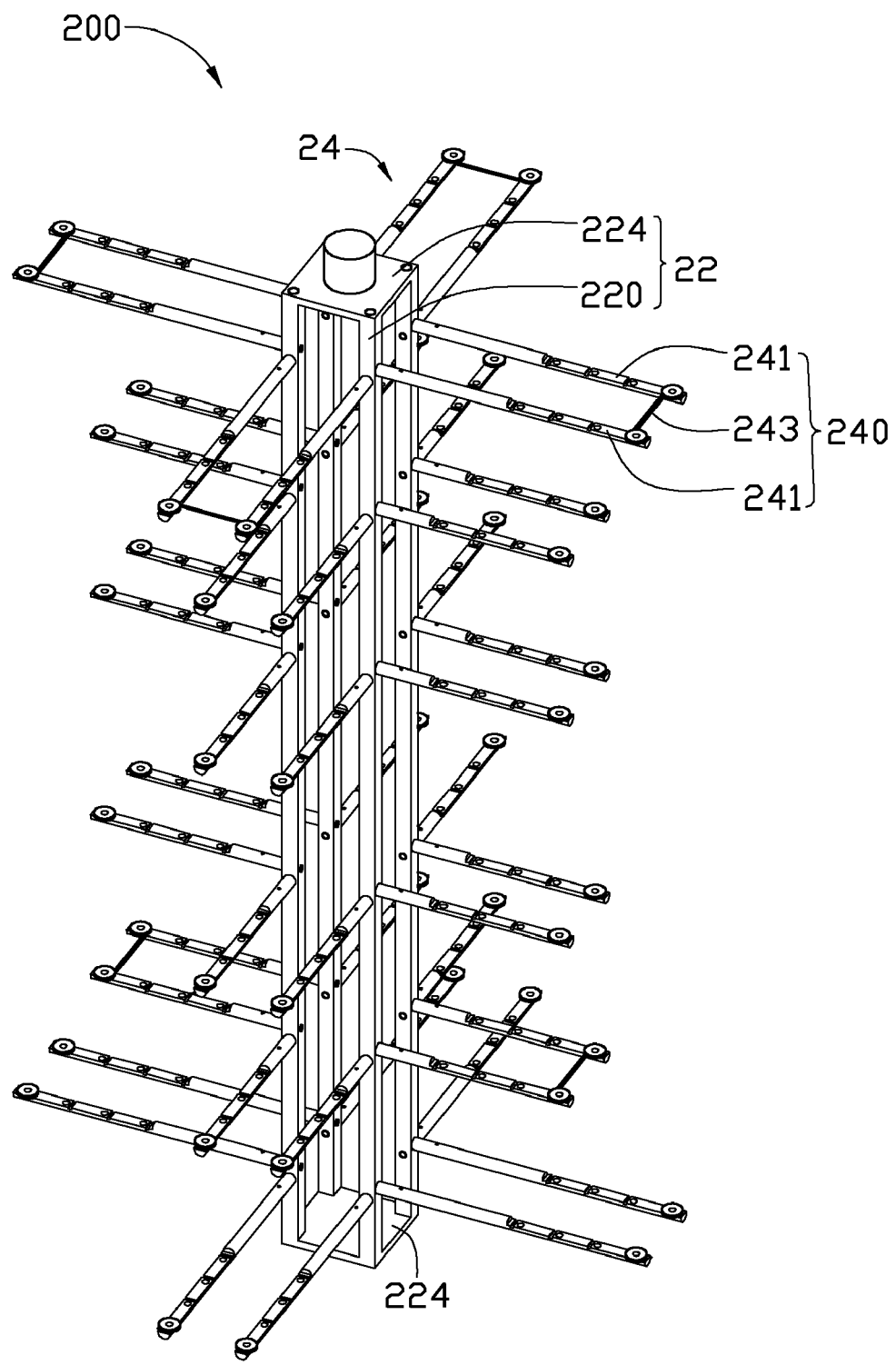
FIG. 1 is a schematic assembled view of an exemplary embodiment of the present evaporation source.

FIG. 1 shows an exemplary evaporation source 200 for a vapor deposition apparatus. The evaporation source 200 includes an electrode assembly 22 and a plurality of supporting assemblies 24 for supporting evaporation bars 60 (best shown in FIG. 3).

The electrode assembly 22 has a generally square cross-section including four electrically conductive poles 220 and two electrically conductive connecting portions 224. The four poles 220 are parallel to and spaced from each other at the corners of the square cross-section. The two connecting portions 224 connect the ends 221 of the poles 220 respectively, thereby the conductive members form a parallel electrical connection of the four poles 220 through the connecting portions 224. The poles 220 and connecting portions 224 may be made of a conductive material, such as copper. Furthermore, the electrode assembly 22 is electrically connected to a power/current source (not shown).

Figure 2:
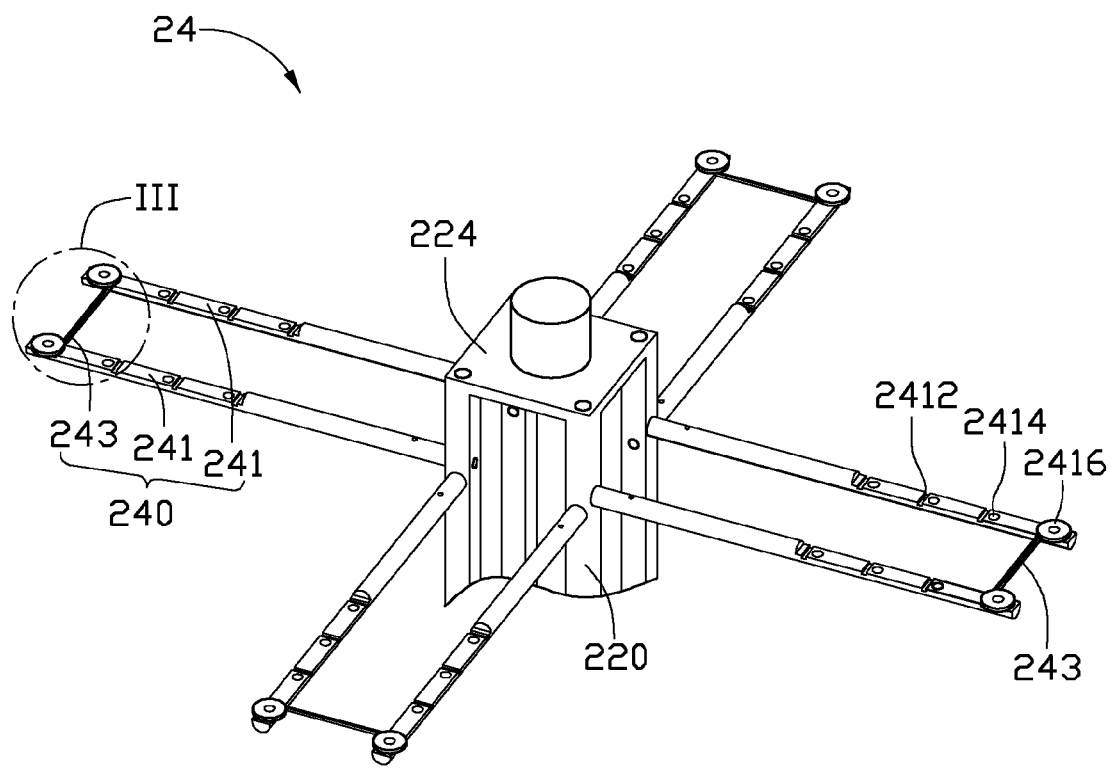
FIG. 2 is a partial isometric view of the evaporation source shown in FIG. 1.

The supporting assemblies 24 are also made from electrically conductive materials and mounted to the poles 220 along the longitudinal axis of the electrode assembly 22. Referring to FIG. 2, each supporting assembly 24 includes four crossed supporting frames 240. The four supporting frames 240 are approximately located in the same plane. Each two adjacent supporting frames 240 are separated by an angle of about 90°.

Each supporting frame 240 includes two parallel supporting arms 241 respectively extending from two adjacent poles 220, and a plurality of resistance elements 243 for producing heat when electrical current passing through the electrode assembly 22 is then passed through the resistance elements 243. The two supporting arms 241 symmetrically define at least a pair of latching grooves 2412 and a fixing hole 2414 near each latching groove 2412. Each fixing hole 2414 is threadedly engaged with a positioning nut 2416.

Figure 3:
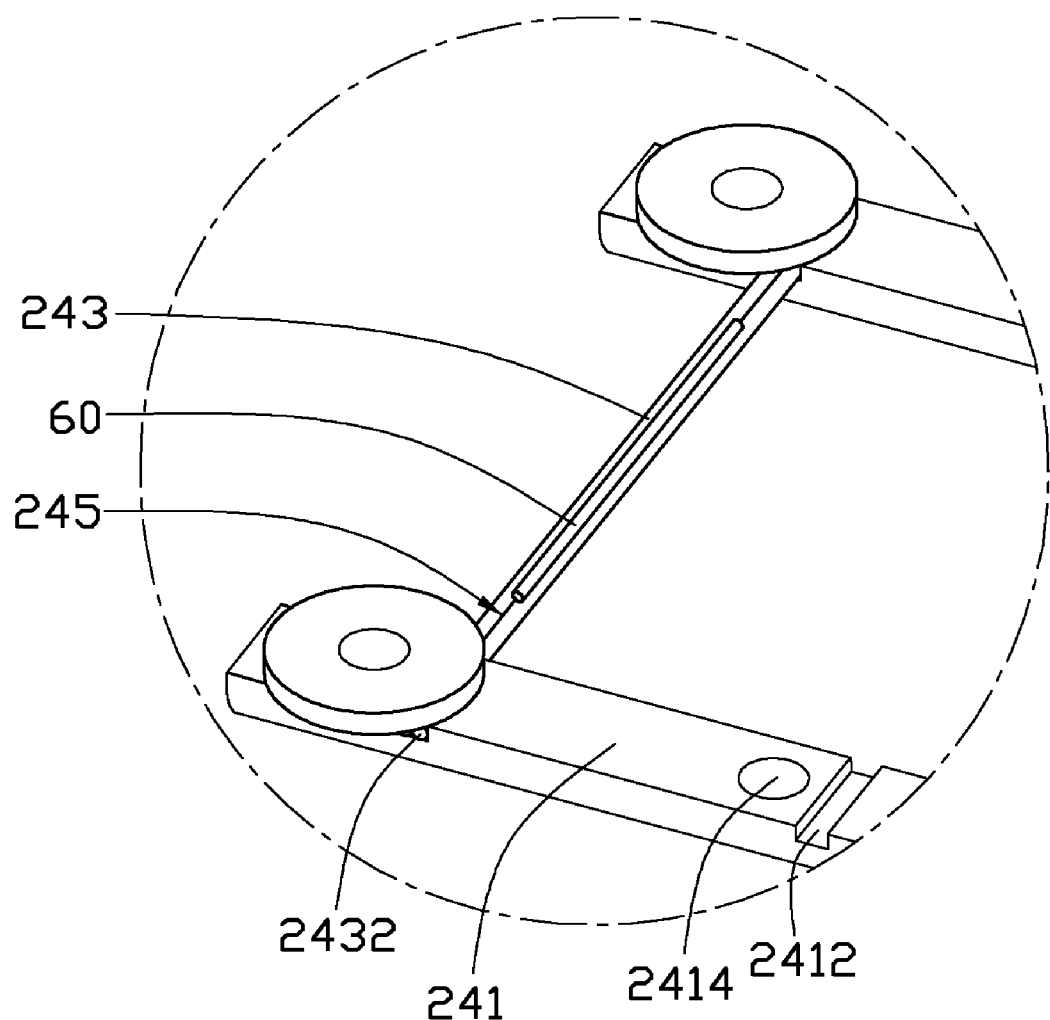
FIG. 3 is a partial enlarged view of circled section III shown in FIG. 2.

Referring to FIG. 3, the resistance elements 243 connect to and are positioned between the two parallel supporting arms 241, with the two ends 2432 secured in the latching grooves 2412. Each pair of latching grooves 2412 defined in the two parallel supporting arms 241 receives two resistance elements 243. The resistance elements 243 are parallelly arranged and define a receiving slot 245 therebetween for receiving an evaporation bar 60. The positioning nuts 2416 press and secure the resistance elements 243 within the latching grooves 2412.

The supporting assemblies 24 are arranged longitudinally along the electrode assembly 22. The distance between two adjacent supporting assemblies 24 gradually increases from the ends of the electrode assembly 22 towards the middle part of the electrode assembly 22. The length of the supporting arms 241 gradually decreases from the ends of the electrode assembly 22 towards the middle part of the electrode assembly 22.

Figure 4:
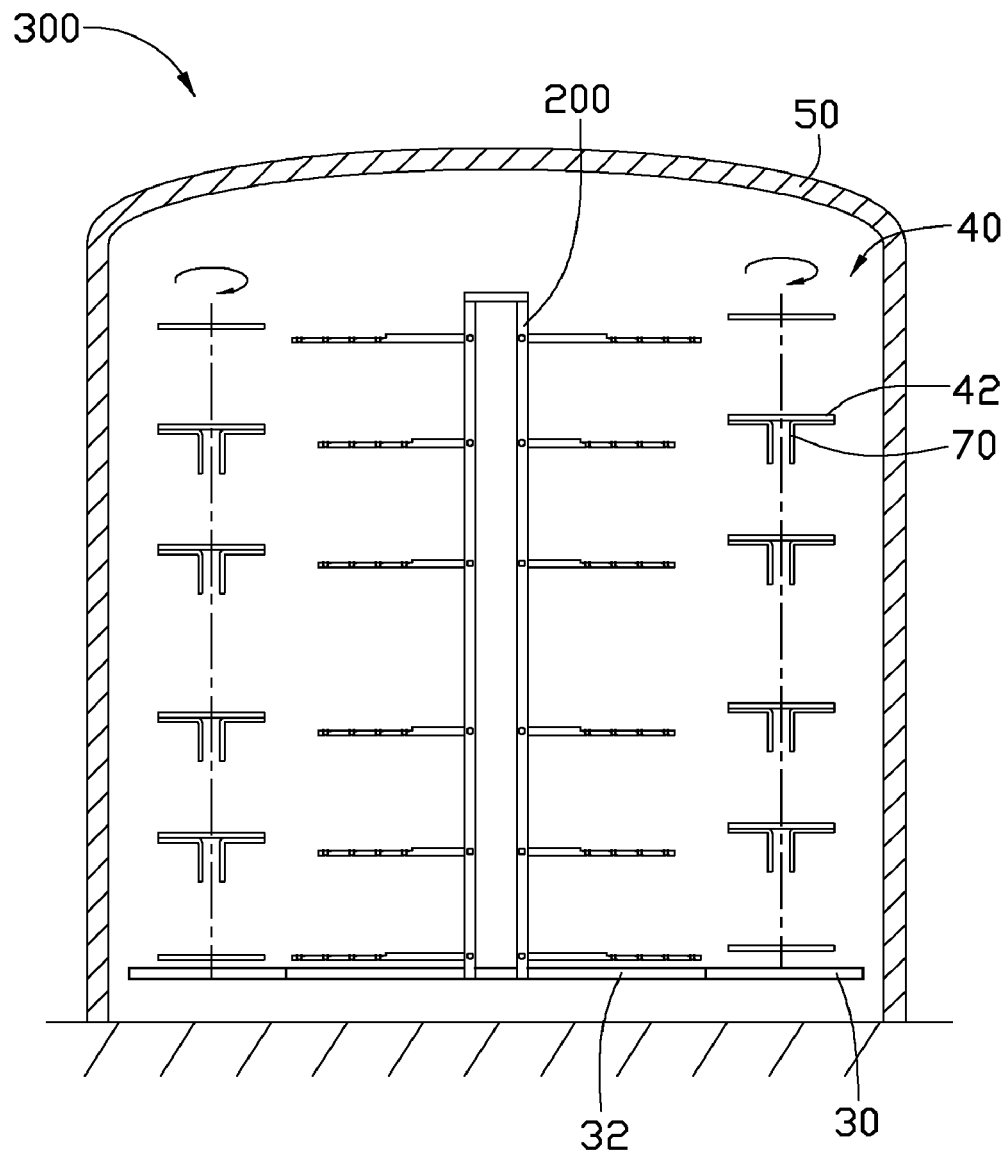
FIG. 4 is a schematic sectional view of an exemplary embodiment of the present vapor deposition apparatus using the evaporation source shown in FIG. 1.
Figure 5:
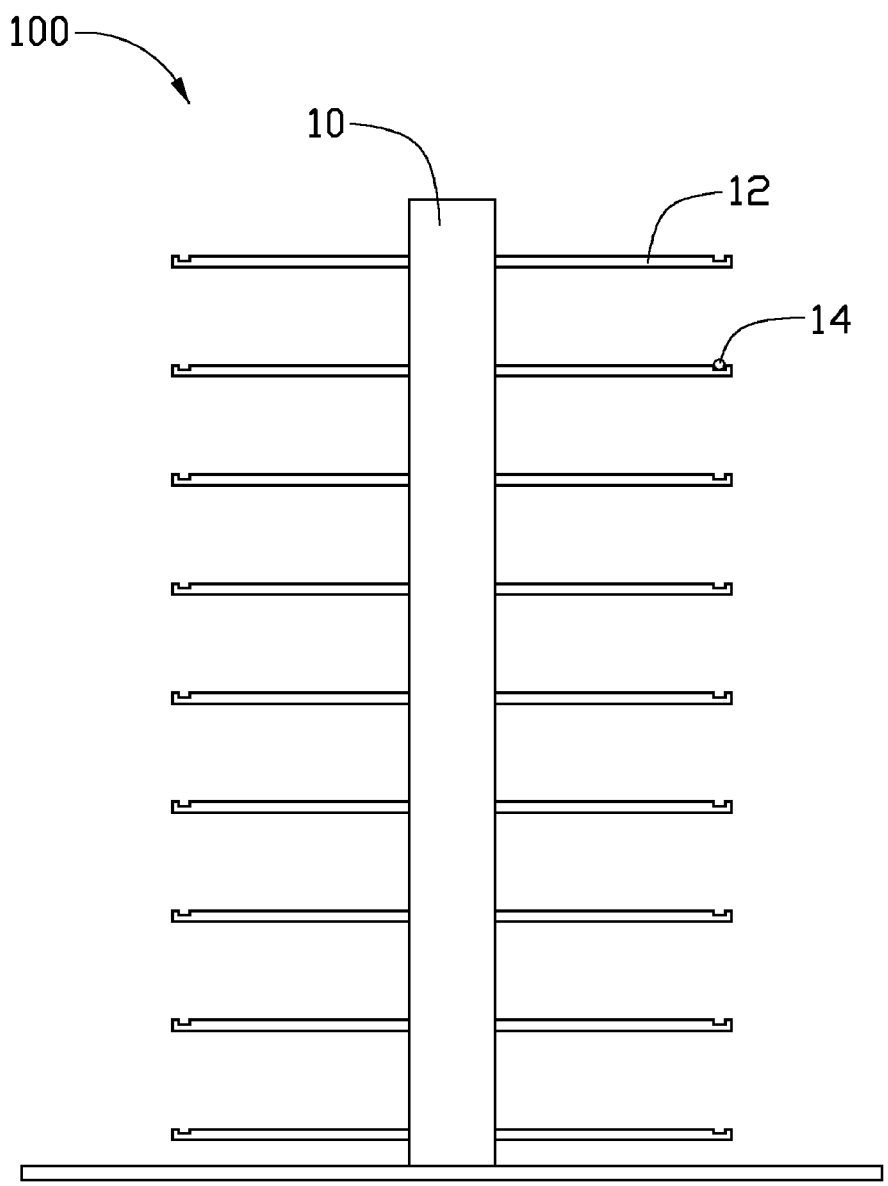
FIG. 5 is a schematic side view of a conventional evaporation source.
Figure 6:
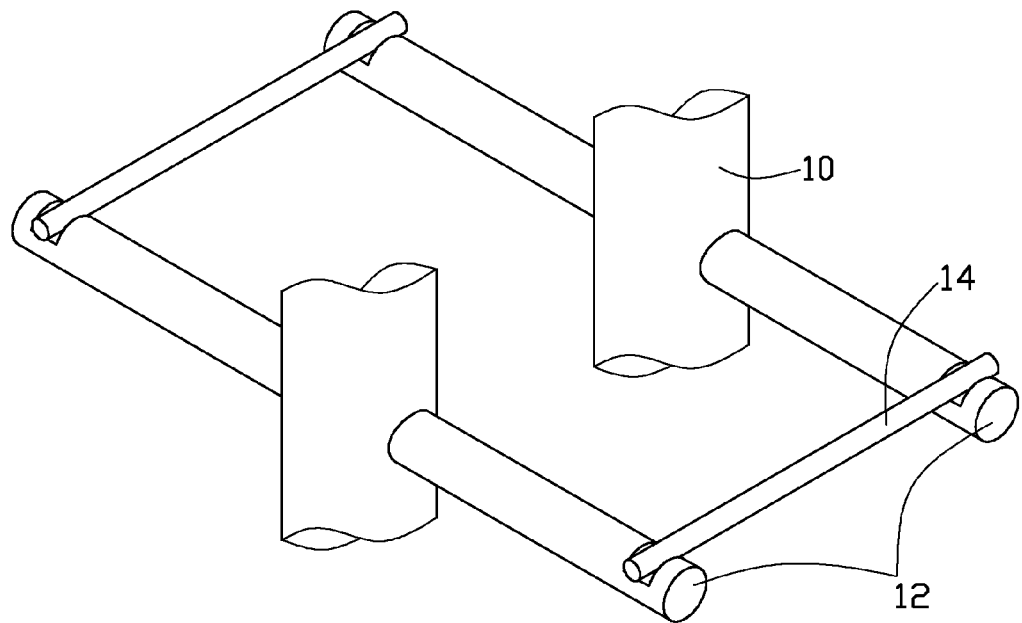
FIG. 6 is a partial isometric view of the conventional evaporation source shown in FIG. 5.

FIG. 4 shows an exemplary vapor deposition apparatus 300 incorporating the above described evaporation source 200. The vapor deposition apparatus 300 includes the evaporation source 200, a chassis 30, a plurality of holders 40 positioned on the chassis 30, and a vacuum chamber 50.

The chassis 30 is annular and defines a through central hole 32. The evaporation source 200 is installed through the central hole 32 in the chassis 30. The chassis 30 is rotatable about the axis of the central hole 32.

The holders 40 are assembled on the chassis 30 and spaced from each other. Each holder 40 includes a plurality of fixing boards 42 for fixing workpieces 70. The holders 40 are self-rotatable and can also rotate along with the rotation of the chassis 30 around the evaporation source 200 using conventional means (not shown).

The vacuum chamber 50 provides a vacuum atmosphere therein. The evaporation source 200, the chassis 30, and the holders 40 are arranged in the vacuum chamber 50.

In use, the workpieces 70 to be coated are fixed to the fixing boards 42 and can rotate along with the holders 40 when rotating around the evaporation source 200 with the chassis 30. The current passing through the electrode assembly 22 cause the resistance elements 243 to heat up and then vaporize the evaporation bars 60 causing the evaporation bars 60 emit small particles. The small particles of the evaporation bars 60 are evenly dispersed all around the evaporation source 200 and then accumulate on the workpieces 70 to form symmetrical films.

It should be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An evaporation source, comprising:
    an electrode assembly, the electrode assembly having four electrically conductive poles and two connecting portions, the poles being parallel to and spaced from each other, the two connecting portions connecting the two ends of each pole respectively to form a parallel electrical connection of the four poles;
    a plurality of electrically conductive supporting assemblies, each supporting assembly being arranged longitudinally along the electrode assembly, each supporting assembly including four crossed supporting frames, each supporting frame comprising two parallel supporting arms respectively extending from two adjacent poles; and
    a plurality of resistance elements, the resistance elements electrically connecting to and positioned between the two parallel supporting arms;
    wherein the distance between adjacent supporting assemblies increases from the ends of the electrode assembly towards the middle part of the electrode assembly.

2. The evaporation source as claimed in claim 1, wherein the length of the supporting arms decreases from the ends of the electrode assembly towards the middle part of the electrode assembly.

3. The evaporation source as claimed in claim 2, wherein the supporting frames of each supporting assembly are approximately located in the same plane, each two adjacent supporting frames being separated by an angle of about 90°.

4. The evaporation source as claimed in claim 1, wherein the two supporting arms of each supporting frame symmetrically define at least a pair of latching grooves therein, each pair of the latching grooves receiving two parallel resistance elements defining a receiving slot therebetween for receiving an evaporation bar.

5. The evaporation source as claimed in claim 4, wherein the supporting arms define a fixing hole near each latching groove, each fixing hole being threadedly engaged with a positioning nut, the positioning nuts pressing and securing the resistance elements in the latching grooves.

6. The evaporation source as claimed in claim 1, wherein the electrode assembly and the supporting arms are made of conductive metal.

7. A vapor deposition apparatus, comprising:
    a vacuum chamber;
    a chassis, the chassis defining a through central hole; and
    a plurality of holders for fixing workpieces, the holders being assembled on the chassis;
    an evaporation source installed through the central hole, the evaporation source comprising:
        an electrode assembly, the electrode assembly having four electrically conductive poles and two connecting portions, the poles being parallel to and spaced from each other, the two connecting portions connecting the two ends of each pole respectively to form a parallel electrical connection of the four poles;
        a plurality of electrically conductive supporting assemblies, each supporting assembly being arranged longitudinally along the electrode assembly, each supporting assembly including four crossed supporting frames, each supporting frame comprising two parallel supporting arms respectively extending from two adjacent poles; and
        a plurality of resistance elements, the resistance elements electrically connecting to and positioned between the two parallel supporting arms;
    wherein the distance between adjacent supporting assemblies increases from the ends of the electrode assembly towards the middle part of the electrode assembly, and the chassis, the holders and the evaporation source are arranged in the vacuum chamber.

8. The vapor deposition apparatus as claimed in claim 7, wherein the length of the supporting arms decreases from the electrode assembly towards the middle part of the electrode assembly.

9. The vapor deposition apparatus as claimed in claim 8, wherein the supporting frames of each supporting assembly are approximately located in the same plane, each two adjacent supporting frames being separated by an angle of about 90°.

10. The vapor deposition apparatus as claimed in claim 7, wherein the two supporting arms of a supporting frame symmetrically define at least a pair of latching grooves therein, each pair of the latching grooves receiving two parallel resistance elements defining a receiving slot between the two resistance elements.

11. The vapor deposition apparatus as claimed in claim 10, wherein the supporting arms define a fixing hole near each latching groove, each fixing hole being threadedly engaged with a positioning nut, the positioning nuts pressing and securing the resistance elements in the latching grooves.

12. The vapor deposition apparatus as claimed in claim 7, wherein the electrode assembly and the supporting arms are made of conductive metal.

* * * * *